United States Patent [19]

Hatano et al.

[11] Patent Number: 4,489,372
[45] Date of Patent: Dec. 18, 1984

[54] OPTICAL GATE SIGNAL GENERATING APPARATUS AND THYRISTOR CONVERTER APPARATUS INCLUDING THE SAME

[75] Inventors: Yukihiko Hatano, Tokyo; Tadashi Takahashi, Kawasaki, both of Japan

[73] Assignee: Tokyo Shibaura Denki Kabushiki Kaisha, Kawasaki, Japan

[21] Appl. No.: 469,752

[22] Filed: Feb. 25, 1983

[30] Foreign Application Priority Data

Mar. 5, 1982 [JP] Japan ............................. 57-34680

[51] Int. Cl.³ .............................................. H02H 7/125
[52] U.S. Cl. ........................................ 363/54; 363/68; 307/311; 307/252 L
[58] Field of Search ................... 363/52, 53, 54, 55, 363/56, 57, 65, 67, 68, 85; 307/252 L, 252 J, 252 K, 252 N, 252 Q, 311

[56] References Cited

U.S. PATENT DOCUMENTS 4,039,925  8/1977  Fletcher et al. ...................... 363/53

FOREIGN PATENT DOCUMENTS 73461    9/1983  European Pat. Off.
469184   9/1973  U.S.S.R. .............................. 363/57

OTHER PUBLICATIONS

"Field Testing of Light-Triggered Thyristors in an Electric Utility Application", L. R. Lowry et al., 1981 IEE, soc/HVDC conf. 1981, 11.
Patents Abstracts of Japan, vol. 5, No. 40 (E-49) [712], Mar. 17, 1981 & JP-A-55 162 875 (Hitachi Seisakusho K.K.) 12-18-1980.
Electronique Applications, No. 15, 1980, pp. 5-15, Paris, "Les Photocoupleurs", Fig. 33b.
Wissenschaftliche Berichte Aeg-Telefunken, vol. 50, 1977, pp. 22-31, Berlin, W. Lukanz, "Halbleiterschalter und-steller fur den Mittelspannungsbereich".

Primary Examiner—William M. Shoop
Assistant Examiner—Jordan Jones
Attorney, Agent, or Firm—Oblon, Fisher, Spivak, McClelland & Maier

[57] ABSTRACT

An optical gate signal generating apparatus for firing a plurality of thyristors in a thyristor converter apparatus, including a circuit for generating an electrical gate signal, a plurality of first light emitting elements, each being connected to receive the electrical gate signal for generating a first optical signal. The apparatus also includes a plurality of auxiliary circuit, each including a series connection of a second light emitting element and a nonlinear element and being connected to receive the electrical gate signal for generating a second optical signal, each of the auxiliary circuits being connected in parallel with each of the first light emitting elements, and a plurality of light guides, each having a first, a second and a third branches, each of the light guides being connected to receive the first and second optical signals at ends of the first and second branches, respectively and for guiding the first and second optical signals to an end of the third branch to produce the optical gate signal. The thyristor converter apparatus including the optical gate signal generating apparatus is also disclosed.

14 Claims, 8 Drawing Figures

OPTICAL GATE SIGNAL GENERATING APPARATUS AND THYRISTOR CONVERTER APPARATUS INCLUDING THE SAME

BACKGROUND OF THE INVENTION

This invention relates to an optical gate signal generating apparatus and relates to a thyristor converter apparatus with an optical gate signal generating apparatus which is fired in accordance with the optical gate signal.

Conventionally an optical gate signal generating apparatus includes a control circuit for generating an electrical gate signal, and a plurality of light emitting elements each generating an optical gate signal upon receipt of the electrical gate signal for firing each of a plurality of thyristors in a thyristor converter apparatus. Such firing method has been developed from the result of the light transmission technique which is rapidly advancing in recent years. Due to improvement on the property of a light-triggered thyristor which is directly operated by an optical signal, the technique has come to be widely accepted which comprises the steps of transmitting an optical signal generated from a light emitting element through a light guide and carrying out the firing of the light-triggered thyristor by the direct application of an optical signal.

Description is now given with reference to FIG. 1 of a conventional optical gate signal generating apparatus 10. The optical gate signal generating apparatus 10 is so arranged as to control a thyristor converter apparatus 12 through a light guide. The thyristor converter apparatus is generally constituted by a plurality of light-triggered thyristors arranged in a multiphase connection. An optical gate signal generating apparatus is provided for each phase. Since all the phases have the same construction, FIG. 1 indicates a circuit diagram of only one phase or arm. The optical gate signal generating apparatus 10 comprises a plurality of light emitting elements A11, A12 ... Amn such as light-emitting diodes or laser diodes. The thyristor converter apparatus 12 comprises light-triggered thyristors B11, B12 ... Bmn corresponding to the above-mentioned light emitting elements A11, A12 ... Amn. Light emitting elements and light-triggered thyristors having the same suffix are connected by light guides C11, C12 ... Cmn bearing the same suffix. When every constituent member need not be distinguished with respect to the groups of the light emitting elements, light-triggered thyristors and light guides, then the light emitting elements, the light-triggered thyristors, and the light guides are collectively represented by A, B and C, respectively. For briefness, FIG. 1 shows only one light guide C11. All the light-triggered thyristors B and a single anode reactor 16 are connected in series between power supply terminals E1 and E2. Each light-triggered thyristor B is connected in parallel to a series circuit including a resistor 20 and a capacitor 22. A resistor 24 is further connected in parallel with the series circuit. The anode reactor 16 is used to control the rate of increase of the current, with respect to time, flowing through the firing light-triggered thyristors B. The resistors 20, 24 and capacitor 22 jointly constitute a voltage-dividing circuit. Description is omitted of the operation of the circuit which is already known.

The optical signal generating apparatus 10 is provided with a control circuit 36, which comprises a gate signal generating circuit or gate signal generator 32, an amplifier 34 and a transistor 30. The m × n light emitting elements, in which m and n are positive integer numbers, are connected in a network including m parallel circuits each comprising n light emitting elements connected in series. Each series circuit constitutes a parallel circuit with a diodes 26. Each of the parallel circuits is connected at one end to a positive power supply terminal F1 through a resistor 28, and at the other end to a negative power supply terminal F2 through the transistor 30. All the light emitting elements A are connected to the power supply terminals F1, F2 in the forward direction and all the diodes 26 are connected with respect to the supply terminals F1, F2 in the reverse direction.

The gate signal generating circuit 32 included in the control circuit 36 generates an electrical gate signal defining a timing in which a light emitting element is to be operated. The output signal is amplified by the amplifier 34, and then delivered to the transistor 30. The transistor 30 switches on or switches off the power supply circuits F1, F2 in accordance with the contents of the signal received. As a result, when voltage is applied on the aforesaid m parallel arranged circuits and current flows through each of the m parallel circuits, then all the light emitting elements A are simultaneously fired in the aforementioned timing. Each optical gate signal generated from the light-emitting element A is conducted through the light guide C to the corresponding light-triggered thyristor B, which in turn is fired in the aforementioned timing. Therefore, the voltage (takes a value about one-m × nth of the source voltage between power terminals E1 and E2) applied on each of the thyristors B at this time changes substantially to zero.

The conventional optical gate signal generating apparatus 10 of FIG. 1 is indeed useful, but is still accompanied with drawbacks. These drawbacks are the very problems for whose resolution this invention is primarily intended. Namely, the prior art optical gate signal generating apparatus has the difficulties as follows. When an open fault arises in any of the light emitting elements A constituting one of the series circuits arranged in parallel in a number of m, the current flowing through the series circuit including the defective light emitting element A is cut off. Among m × n light-triggered thyristors connected in series in the thyristor converter apparatus 12, n light-triggered thyristors B connected by the light guides C to the series circuit including the defective light-emitting element A are not fired. Consequently the voltage applied up to this time on the series circuit consisting of m × n light-triggered thyristors is now applied to the n light-triggered thyristors corresponding to the aforesaid defective series circuit of light emitting elements A. Therefore n light-triggered thyristors are damaged due to application of excessively high voltage, thereby disenabling the thyristor converter apparatus 12.

To resolve the aforementioned drawbacks and increase the reliablility of the thyristor converter apparatus, it has been contemplated to provide a multi-type optical gate signal generating apparatus shown in FIG. 2. The multi-type optical gate signal generating apparatus constructed by providing two optical gate signal generating apparatuses, for example, 10a, 10b and connecting corresponding light emitting elements A1, A2 of the optical gate signal generating apparatuses 10a, 10b to one of the light-triggered thyristors B through a light guide Da. This multi-type optical gate signal generating apparatus indeed has the advantage that even when one of said paired optical gate signal generating apparatuses fails, the operation of the thyristor converter apparatus 12 can be continued. But the multi-type optical gate signal generating apparatus still has the drawbacks as follows. The provision of the two, for example, control circuits 36a, 36b leads to larger power consumption. All the light emitting elements A1, A2 included in the multi-type optical gate signal generating apparatus are always rendered conductive and consequently deteriorated substantially at the same rate. As a plurality of optical gate signal generating apparatuses are provided in the multi-type apparatus, the construction as well as the electric circuit thereof becomes dual and complicated. And the application of numerous parts undesirably raises the failure rate with which failures arise, thereby reducing the reliability of the multiple-type optical gate signal generating apparatus as a whole.

SUMMARY OF THE INVENTION

Accordingly, one object of this invention is to provide an optical gate signal generating apparatus which can increase the reliability thereof with a simple construction.

It is another object of this invention to provide an optical gate signal generating apparatus, which, even when one of the light emitting elements is subject to increased dynamic impedance or open fault, and an optical gate signal is not generated from the defective light emitting element, enables a normal light emitting element connected to the defective light emitting element to be put into operation in place of the disabled light emitting element, and consequently assures the uninterrupted emission of an optical gate signal.

Another object of this invention is to provide a thyristor converter apparatus including an optical gate signal generating apparatus wherein the reliability thereof can be increased.

These and other objects of this invention can be achieved by providing an optical gate signal generating apparatus for firing a plurality of thyristors in a thyristor converter apparatus, including a circuit for generating an electrical gate signal. The optical gate signal generating apparatus also includes a plurality of first light emitting elements, each being connected to receive the electrical gate signal for generating a first optical signal and a plurality of auxiliary circuits, each including a series connection of a second light emitting element and a nonlinear element and being connected to receive the electrical gate signal for generating a second optical signal, each of the auxiliary circuits being connected in parallel with each of the first light emitting elements. The optical gate signal generating apparatus further includes a plurality of light guides, each having a first, a second and a third branches, each of the light guides being connected to receive the first and second optical signals at ends of the first and second branches, respectively and for guiding the first and second optical signals to an end of the third branch to produce the optical gate signal.

According to this invention there is further provided a thyristor converter apparatus, including, a circuit for generating an electrical gate signal, a plurality of first light emitting elements, each being connected to receive the electrical gate signal for generating a first optical signal. The thyristor converter apparatus also includes a plurality of auxiliary circuit, each including a series connection of a second light emitting element and a nonlinear element and being connected to receive said electrical gate signal for generating a second optical signal, each of the auxiliary circuits being connected in parallel with each of the first light emitting elements, and a plurality of light guides, each having a first, a second and a third branches, each of the light guides being connected to receive the first and second optical signals at ends of the first and second branches, respectively and for guiding the first and second optical signals to an end of the third branch to produce an optical gate signal. The thyristor converter apparatus further includes a plurality of thyristors, each being connected to receive the optical gate signal from the end of the third branch of each of the light guides as a gate signal, thereby operating in accordance with the gate signal.

In the optical gate signal generating apparatus arranged as described above, each of the first light emitting elements and each of the auxiliary circuits is subjected to a low operating voltage. Each of the first light emitting elements ordinarily generates the optical gate signal. While under application of such a low operating voltage, according to a high resistance of the nonlinear element, only a very small current is permitted to flow through the auxiliary circuit, and no light signal is generated from the second light emitting element, that is, the auxiliary circuit makes no contribution to generate an optical gate signal.

When, however, an dynamic impedance increases, or an open fault of the first light emitting element arises due to the deterioration of them, the voltage across the first light emitting element and the auxiliary circuit begins to increase and the voltage applied to the nonlinear element reaches a predetermined value, then current flows through the nonlinear element and second light emitting element. The predetermined value is a voltage value at which the current through nonlinear element is abruptly increased and the voltage applied to the nonlinear element is decreased. As a result, the value of the current through the second light emitting element is settled down substantially to the value of the current flowing through the first light emitting element before the occurence of the failure. Then the second light emitting element generate an optical gate signal in place of the first light emitting element quickly and automatically. Therefore, an implement, for example, thyristor converter apparatus provided with an optical gate signal generating apparatus embodying this invention can continue a normal operation without being adversely affected by the failure of the first light emitting element.

The optical gate signal generating apparatus of this invention offers the advantages as follows. The second light emitting element of the auxiliary circuit is operated only when the corresponding first light emitting element fails, and consequently is not substantially deteriorated at any other time. The function of the disabled first light emitting element is automatically replaced by the function of the second light emitting element. Half the light emitting elements included in the subject optical gate signal generating apparatus are connected as spare ones and no steady current or no normal operating current flows therethrough, so that a control circuit for operating the first and second light emitting elements consumes only small power. And even if a fault of the first light emitting element occurs, the thyristor converter apparatus can operate continuously.

DETAILED DESCRIPTION OF THE PREFERRED EMBODIMENTS

Figure 1:
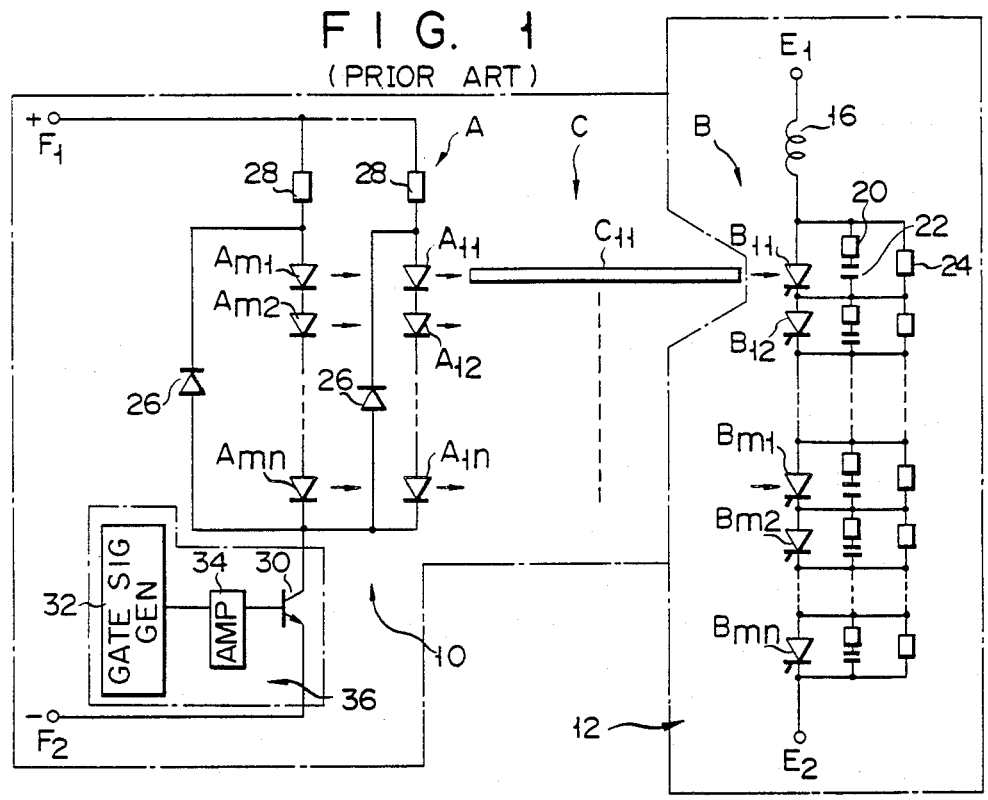
FIG. 1 is a circuit diagram of a conventional thyristor converter apparatus using an optical gate signal generating apparatus.
Figure 3:
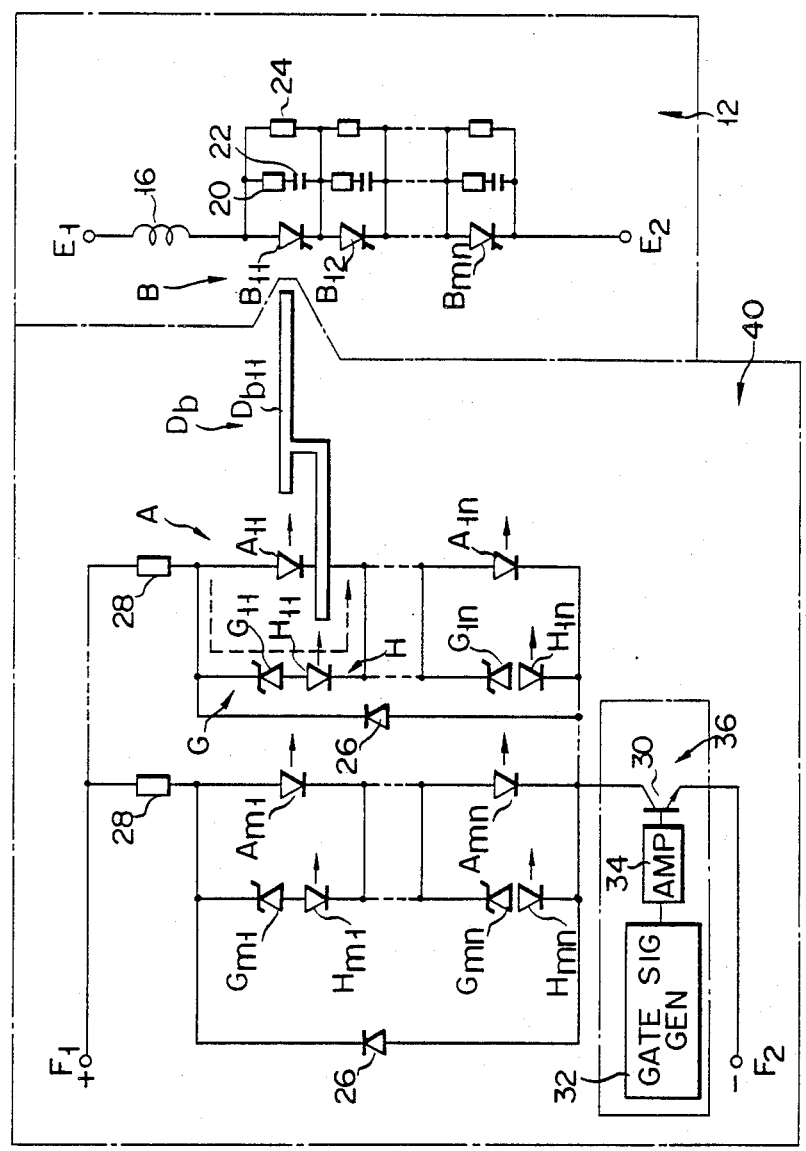
FIG. 3 is the circuit diagram of an optical gate signal generating apparatus used in a thyristor converter apparatus according to a first embodiment of this invention.

Description is now given with reference to FIG. 3 of an optical gate signal generating apparatus 40 according to a first embodiment of this invention. The parts of FIG. 3 which are same as those of FIG. 1 are denoted by the same numerals as in FIG. 1. FIG. 3 differs from FIG. 1 only in that the subject optical gate signal generating apparatus 40 includes a series circuit or an auxiliary circuit which includes a nonlinear element G (for example G11) and a second light emitting element H (for example H11) and is connected in parallel with a first light emitting element A (for example A11). The first light emitting element A (for example A11) and the second light emitting element H (for example H11) are connect to the corresponding light-triggered thyristor B (for example B11) of the thyristor converter apparatus 12 through a light guide Db (for example Db11). The nonlinear element G included in the embodiment of FIG. 3 is formed of a Zener diode connected in the reverse direction. While all the first light emitting elements A in the optical gate signal generating apparatus 40 of FIG. 3 are normally operated, when a transistor 30 switches on, a predetermined current flows through each of the m series circuits in which n first light emitting elements A (for example A11~A1n) are provided. The forward voltage drop of each of the first light emitting elements A which is relatively low is also applied to each of the auxiliary circuits. The nonlinear element G is connected in the reverse direction. At the above-mentioned low voltage, therefore, substantially no current flows through the nonlinear element G. Therefore, the series circuit consisting of the nonlinear element G and second light emitting element H takes substantially no action.

Figure 2:
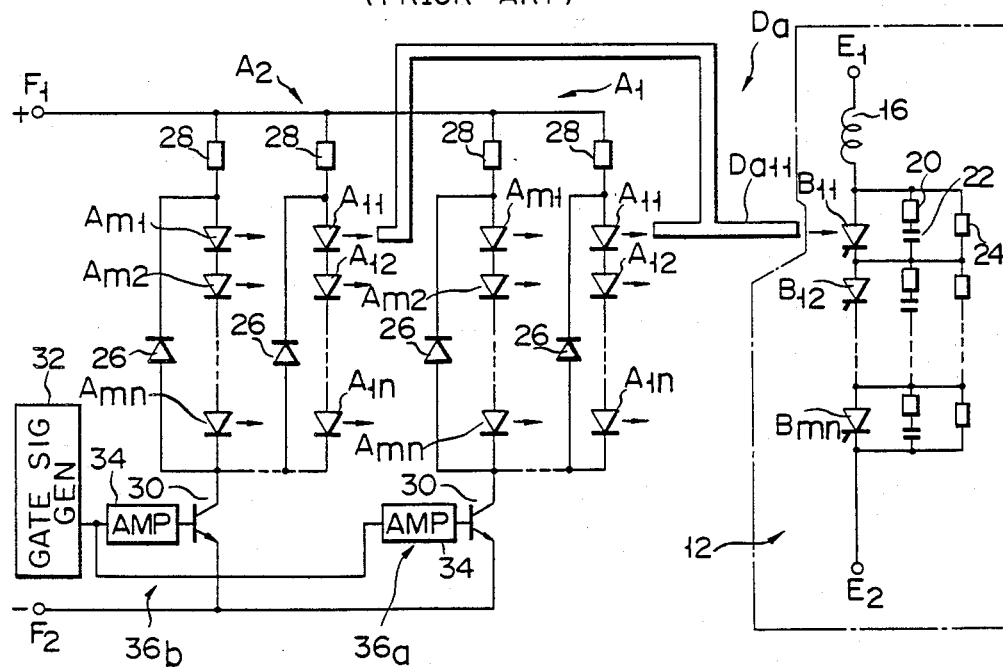
FIG. 2 is a modification of the conventional optical gate signal generating apparatus of FIG. 1.

When an open fault arises in, for example, the first light emitting element A11 of the above-mentioned optical gate signal generating apparatus 40, the voltage applied to the particular first light emitting element A11 and the auxiliary circuit connected in parallel thereto begins to rise from the relatively low voltage, i.e. forward voltage of the first light emitting element A11, and when the voltage reaches a value i.e. a sum of the forward voltage drop of the second light emitting element H11 and the Zener voltage of the Zener diode G11, a current flows through the linear element G11 in the direction of an arrow as shown in a dashed line. This operation arises from a nonlinear impedance realized by the reverse characteristics of the Zener diode. Due to the open fault ocurring in the first light emitting element A11, therefore, the auxiliary circuit consisting of the nonlinear element G11 and second light emitting element H11 is automatically operated and instead of the first light emitting element A11 which has heretofore generated an optical signal i.e. first optical gate signal, the element H11 is driven to generate an optical gate signal i.e. second optical gate signal. This optical signal is delivered to the light-triggered thyristor B11 through the light guide Db11. Even when, therefore, an open fault arises in the first light emitting element A11, the thyristor converter apparatus 12 can be operated in the same manner as before the occurrence of said open fault. Further even when the dynamic impedance of the first light emitting element A11 and consequently the voltage applied to the element A11 increase and the voltage across the element A11 reaches a value which is a sum of the forward voltage drop of the second light emitting element H11 and Zener voltage of the Zener diode G11, a current flows through the nonlinear element G11. Thus, the second light emitting element H11 generate an optical gate signal in place of the first light emitting element A11 as in the aforementioned case. As seen from FIG. 3, the light-sending side of the light guide Db11 is divided into two branches, which are respectively connected to the first light emitting element A11 and second light emitting element H11. The light-receiving side of the light guide Db11 is connected to the light-triggered thyristor B11. When, therefore, change over takes place between the light emitting elements A11, H11, an optical gate signal is ceaselessly sent forth to the light-triggered thyristor B11, thereby preventing the light-triggered thyristor B11 from being deteriorated or damaged. As apparent from the foregoing description, it may be assumed that substantially no current is conducted through the auxiliary circuit. Further even when current happens to run through the auxiliary circuit connected to the first light emitting element A11 due to its failure, substantially no adverse effect is exerted on an auxiliary circuit connected in parallel to any other first light emitting element. Therefore, substantially no current flows through any other second light emitting element than the second light emitting element H11 which is operated in place of the first light emitting element A11. Consequently, the other second light emitting element is kept to be saved from deterioration with respect to time. With the optical gate signal generating apparatus of this invention, changeover from the first light emitting element A to the second light emitting element H is automatically effected, thereby conveniently reducing number of times for carrying out the maintenance and repair of the thyristor converter apparatus. Further, as shown in FIG. 3, only one control circuit 36 sufficiently serves the purpose, assuring the consumption of smaller power for the control circuit than in the case of the conventional optical gate signal generating apparatus of FIG. 2.

The foregoing description referred to the case where failure occurred only in one (for example, A11) of the m×n first light emitting elements A included in the optical gate signal generating apparatus 40. As previously described, however, even when failure takes place in two or more of the m×n first light emitting elements A which bear different suffixes than 11, the corresponding second light emitting elements H generate an optical signal in place of the defective first light emitting elements A. Therefore the thyristor converter apparatus can smoothly continue operation. In this case a sum of the terminal voltages of the nonlinear element G and second light emitting element H is increased to a value somewhat larger than the normal terminal voltage of the first light emitting element A. Therefore the current flowing through the defective series circuit is decreased to a somewhat smaller value than that flowing before the occurrence of the failure. The value of such decrease can be diminished by selecting a suitable power supply voltage between terminals F1 and F2 and a suitable resistance of the resistor 28. Thus even when a failure of one or more light emitting elements happen, current flowing through each of the nondefective first light emitting elements and second light emitting elements can be held higher than a predetermined level.

Figure 4A:
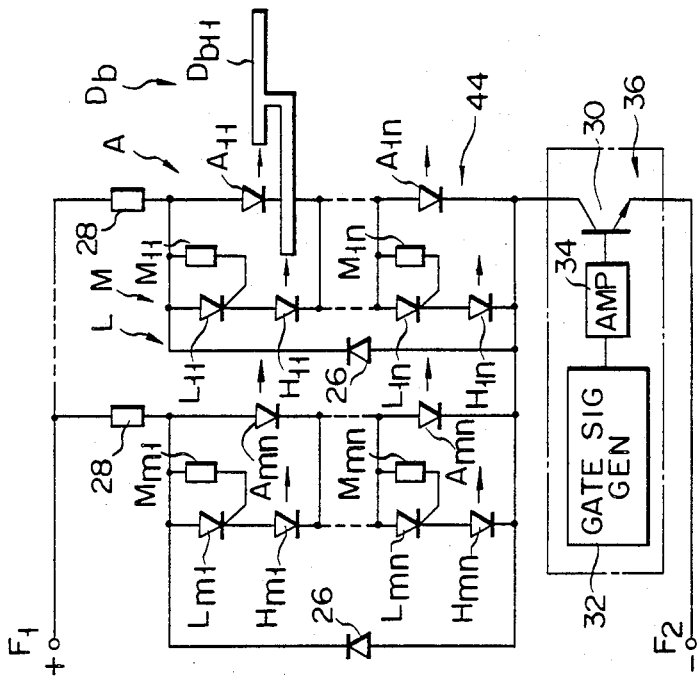
FIGS. 4A, 4B, 5A and 5B each indicates the arrangement of optical gate signal generating apparatus according to another embodiment of the invention.
Figure 4B:
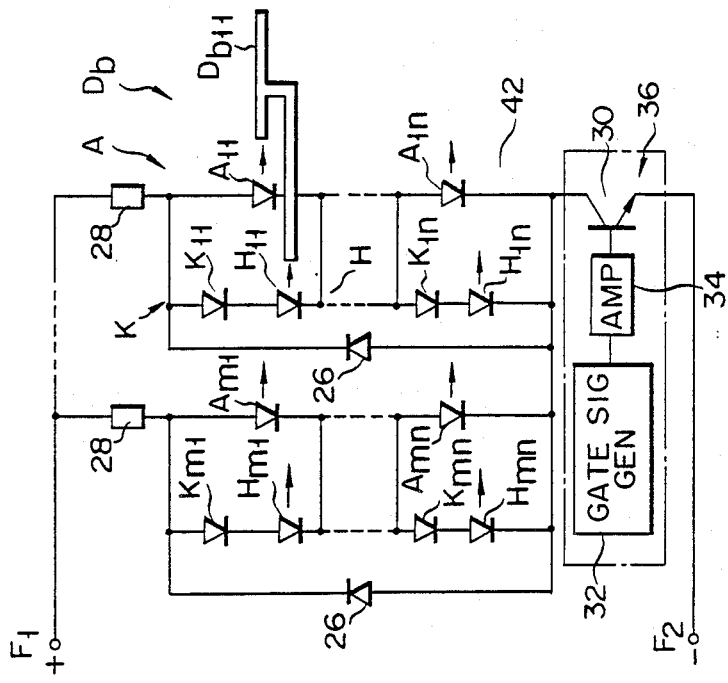

Description is now given with reference to FIGS. 4A and 4B of another embodiment of this invention. FIG. 4A illustrates an optical gate signal generating apparatus 42 having substantially the same arrangement as the apparatus 40 of FIG. 3. FIG. 4A differes from FIG. 3 only in that the nonlinear elements of the apparatus 42 are formed of forward connected diodes K (respectively bearing the suffixes 11 to mn) in place of reverse connected Zener diodes G. In the case of FIG. 4A, a sum of the dynamic impedance of the diodes K and second light emitting elements H is chosen to be larger than the dynamic impedance of the light emitting elements A, thereby assuring the same operation and effect as in FIG. 3. In the optical gate signal generating apparatus 44 of FIG. 4B, the nonlinear elements G included in the apparatus 40 of FIG. 3 are replaced by thyristors L (respectively bearing suffixes 11 to mn) and resistors M (respectively bearing suffixes 11 to mn). In this case, for example, the thyristor L11 is connected in the forward direction between the resistor 28 and first light emitting element H11 and resistor M11 is connected between the resistor 28 and the base terminal of the thyristor L11. When an abnormally high dynamic impedance or open fault arises in any of the first light emitting elements A due to its failure, then the thyristor L is fired and the current which flowed through the first light emitting element A up to this point is conducted to the second light emitting element H.

The dynamic impedance of the nonlinear elements K and the thyristor L of FIGS. 4A and 4B can be chosen to have a lower level than the dynamic impedance of the nonlinear element G of FIG. 3. Even where, therefore, an open fault takes place in one or more of the first light emitting elements A, currents flowing through now operating first light emitting elements can be initially set such that it suffers any substantial influence from the failure. As a result, the optical gate signal generating apparatuses 42, 44 can ceaselessly generate an optical gate signal substantially as before the occurrence of the fault.

Figure 5A:
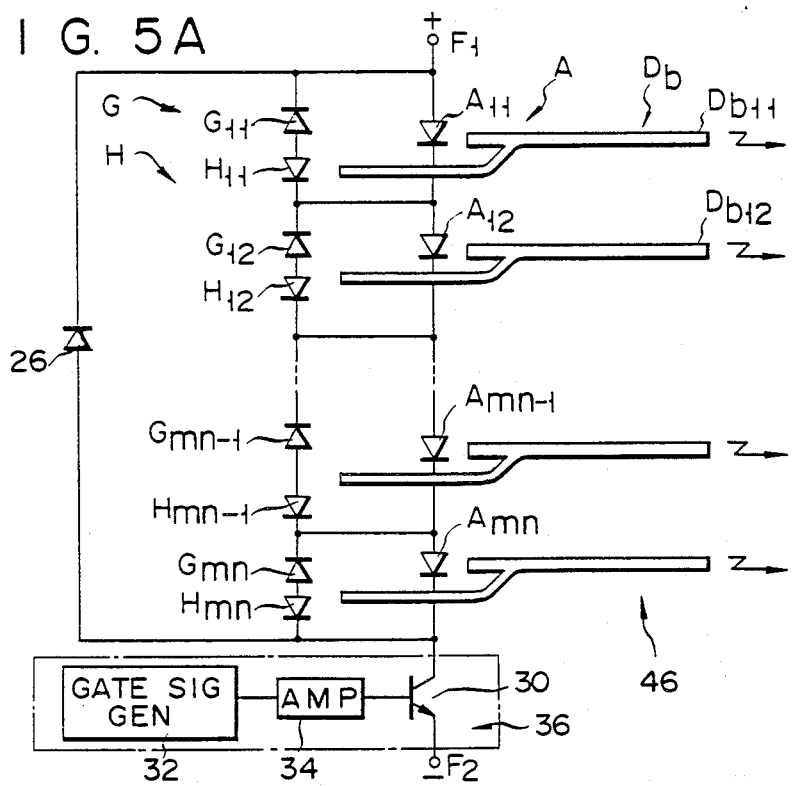
Figure 5B:
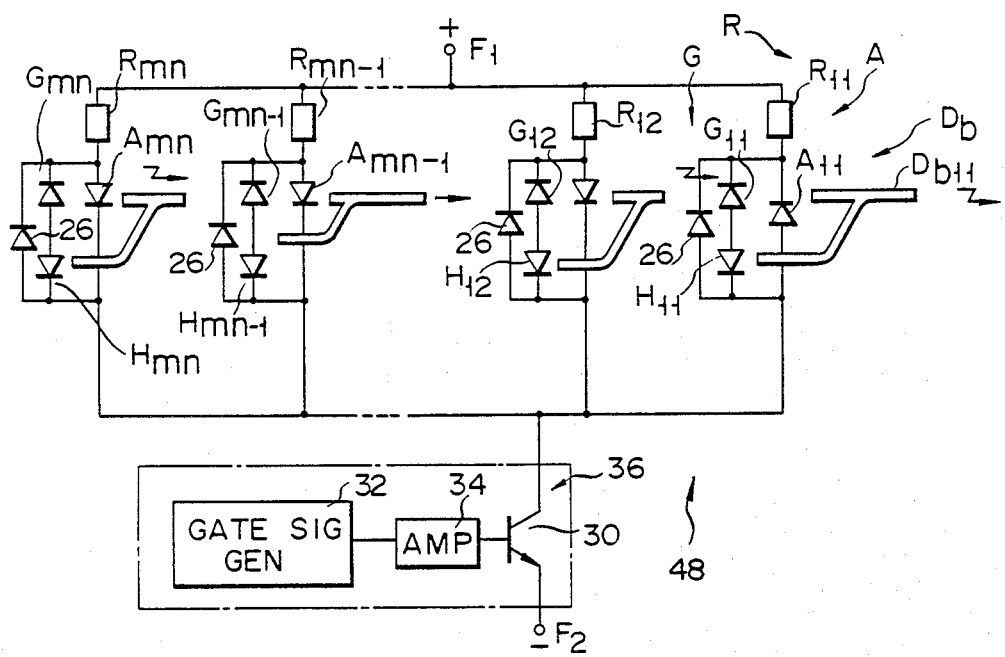

Description is now given with reference to FIGS. 5A and 5B of optical gate signal generating apparatuses 46, 48 two other embodiments of this invention. With the apparatus 46 of FIG. 5A, all the first light emitting elements A11 to Amn are connected in series. A series circuit consisting of the nonlinear element G and the second light emitting element H is connected in parallel to each of the first light emitting elements A11 to Amn. The apparatus 46 of FIG. 5A is adapted to the case in which the value of current flowing through the transistor 30 is desired to be low.

With the optical gate signal generating apparatus 48 of FIG. 5B, all the first light emitting elements A11 to Amn are connected in parallel, and series circuits, each consisting of the nonlinear element G and second light emitting element H, are connected in parallel to the first light emitting elements A11 to Amn. All the parallel circuits thus formed are connected to the power supply terminals F1, F2 through the corresponding voltage-reducing resistors R (bearing suffixes 11 to mn). The apparatus 48 is adapted to be applied when a apparatus is desired which can operate under low power supply voltage. The optical gate signal generating apparatuses 42, 44, 46 and 48 of FIGS. 4A, 4B, 5A and 5B have the same advantageous effect as that of FIG. 3. Namely even when a light emitting element included in an optical gate signal generating apparatus is deteriorated or, for example, an open fault arises in the first light emitting element, it is possible to prevent the damage of the light-triggered thyristor included in a thyristor converter apparatus controlled by the optical gate signal generating apparatus. Therefore, the optical gate signal generating apparatuses 42, 44, 46 and 48 arranged as shown in FIG. 4A, 4B, 5A and 5B have a high reliability. The reason is that when a first light emitting element fails, then a second light emitting element is automatically driven and commence to generate an optical gate signal instead of the defective first light emitting element. This invention provides an optical gate signal generating apparatus which consumes smaller power than the conventional multi-type optical gate signal generating apparatus.

Figure 6:
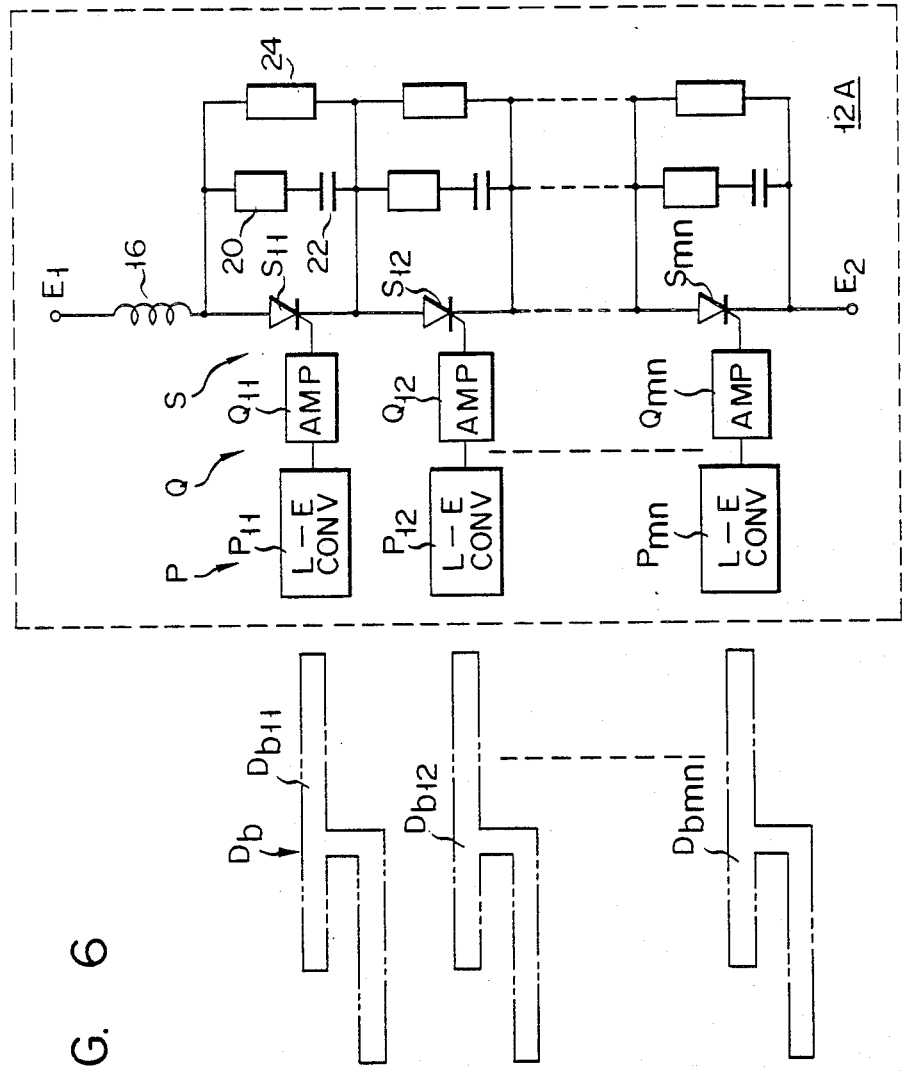
FIG. 6 indicates a circuit diagram of a indirectly optically fired thyristor converter apparatus.

The foregoing description referred to the case where, for example, a thyristor converter apparatus including light-triggered thyristors is directly controlled by optical gate signals delivered from the optical gate signal generating apparatus of this invention. However, as shown in FIG. 6 the optical gate signal generating apparatus can also be applied to control the so-called indirectly optically fired thyristor converter apparatus 12A which includes electrically triggered thyristors S each connected in place of the light-triggered thyristor B and is operated by electrical gate signals each converted from an optical gate signal delivered from the optical gate signal generating apparatus, for example the apparatus 40 of FIG. 3 by means of a light-electricity converter P and an amplifier Q. For simplicity each light-electricity converter is entered in FIG. 6 as L-E CONV.

What we claim is:

1. An optical gate signal generating apparatus for firing a plurality of thyristors in a thyristor converter apparatus, comprising:
   means for generating an electrical gate signal;
   a plurality of first light emitting elements, each being connected to receive said electrical gate signal for generating a first optical signal;
   a plurality of auxiliary circuits, each including a series connection of a second light emitting element and a nonlinear element and being connected to receive said electrical gate signal for generating a second optical signal, each of said auxiliary circuits being connected in parallel with each of said first light emitting elements; and
   a plurality of light guides, each having a first, a second and a third branches, each of said light guides being connected to receive said first and second optical signals at ends of said first and second branches, respectively and for guiding said first and second optical signals to an end of said third branch to produce said optical gate signal.

2. The optical gate signal generating apparatus according to claim 1, wherein said nonlinear element includes a diode.

3. The optical gate signal generating apparatus according to claim 2, wherein said diode includes a Zener diode.

4. The optical gate signal generating apparatus according to claim 1, wherein said nonlinear element includes a thyristor.

5. The optical gate signal generating apparatus according to claim 1, wherein said plurality of first light emitting elements are connected in a series connection.

6. The optical gate signal generating apparatus according to claim 1, wherein said plurality of first light emitting elements are connected in a parallel connection.

7. The optical gate signal generating apparatus according to claim 1, wherein said plurality of first light emitting elements are connected in a series-parallel connection.

8. The optical gate signal generating apparatus according to claim 1, wherein said first light emitting element includes a first light emitting diode, and said second light emitting element includes a second light emitting diode having substantially the same performance as that of the first light emitting diode.

9. The optical gate signal generating apparatus according to claim 1, wherein said first light emitting element includes a first laser element, and said second light emitting element includes a second laser element having substantially the same performance as that of said first laser element.

10. A thyristor converter apparatus, comprising:
   means for generating an electrical gate signal;
   a plurality of first light emitting elements, each being connected to receive said electrical gate signal for generating a first optical signal;
   a plurality of auxiliary circuit, each including a series connection of a second light emitting element and a nonlinear element and being connected to receive said electrical gate signal for generating a second optical signal, each of said auxiliary circuits being connected in parallel with each of said first light emitting elements;
   a plurality of light guides, each having a first, a second and a third branches, each of said light guides being connected to receive said first and second optical signals at ends of said first and second branches, respectively and for guiding said first and second optical signals to an end of said third branch to produce an optical gate signal; and
   a plurality of thyristors, each being connected to receive said optical gate signal from said end of said third branch of each of said light guides as a gate signal, thereby operating in accordance with said gate signal.

11. The thyristor converter apparatus according to claim 10, wherein said plurality of thyristors are connected in a series connection.

12. The thyristor converter apparatus according to claim 10, wherein said thyristor includes a light-triggered thyristor.

13. The thyristor converter apparatus according to claim 12, wherein said plurality of light-triggered thyristors are connected in a series connection.

14. The thyristor converter apparatus according to claim 10, further comprising a plurality of light-electricity converter means, each being provided between each of said light guides and each of said thyristors for receiving said optical gate signal from said end of said third branch of each of said light guides and for converting said optical gate signal into said gate signal, wherein, said thyristor includes an electrically triggered thyristor.

* * * * *